United States Patent
Wang et al.

(10) Patent No.: US 7,989,232 B2
(45) Date of Patent: Aug. 2, 2011

(54) METHOD OF USING ELECTRICAL TEST STRUCTURE FOR SEMICONDUCTOR TRENCH DEPTH MONITOR

(75) Inventors: Qingfeng Wang, Plano, TX (US); Sameer P. Pendharkar, Allen, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 11/531,103

(22) Filed: Sep. 12, 2006

(65) Prior Publication Data

US 2008/0085569 A1    Apr. 10, 2008

(51) Int. Cl.
*H01L 21/66* (2006.01)
*H01L 27/07* (2006.01)

(52) U.S. Cl. ............... 438/18; 257/48; 257/541
(58) Field of Classification Search .............. 438/10–18, 438/427; 257/48, 541, E21.531
See application file for complete search history.

(56) References Cited

U.S. PATENT DOCUMENTS

| 6,130,122 | A | 10/2000 | Johnson |
| 6,342,401 | B1 * | 1/2002 | Tom ................................ 438/17 |
| 6,531,745 | B1 * | 3/2003 | Woolery et al. ............... 257/363 |
| 6,570,239 | B2 * | 5/2003 | Sakakibara et al. .......... 257/536 |
| 2002/0127818 | A1 * | 9/2002 | Lee et al. ....................... 438/424 |
| 2006/0202305 | A1 * | 9/2006 | Hueting ........................ 257/565 |

\* cited by examiner

*Primary Examiner* — Calvin Lee
(74) *Attorney, Agent, or Firm* — Warren L. Franz; Wade J. Brady, III; Frederick J. Telecky, Jr.

(57) ABSTRACT

Embodiments provide a method and device for electrically monitoring trench depths in semiconductor devices. To electrically measure a trench depth, a pinch resistor can be formed in a deep well region on a semiconductor substrate. A trench can then be formed in the pinch resistor. The trench depth can be determined by an electrical test of the pinch resistor. The disclosed method and device can provide statistical data analysis across a wafer and can be implemented in production scribe lanes as a process monitor. The disclosed method can also be useful for determining device performance of LDMOS transistors. The on-state resistance (Rdson) of the LDMOS transistors can be correlated to the electrical measurement of the trench depth.

11 Claims, 5 Drawing Sheets

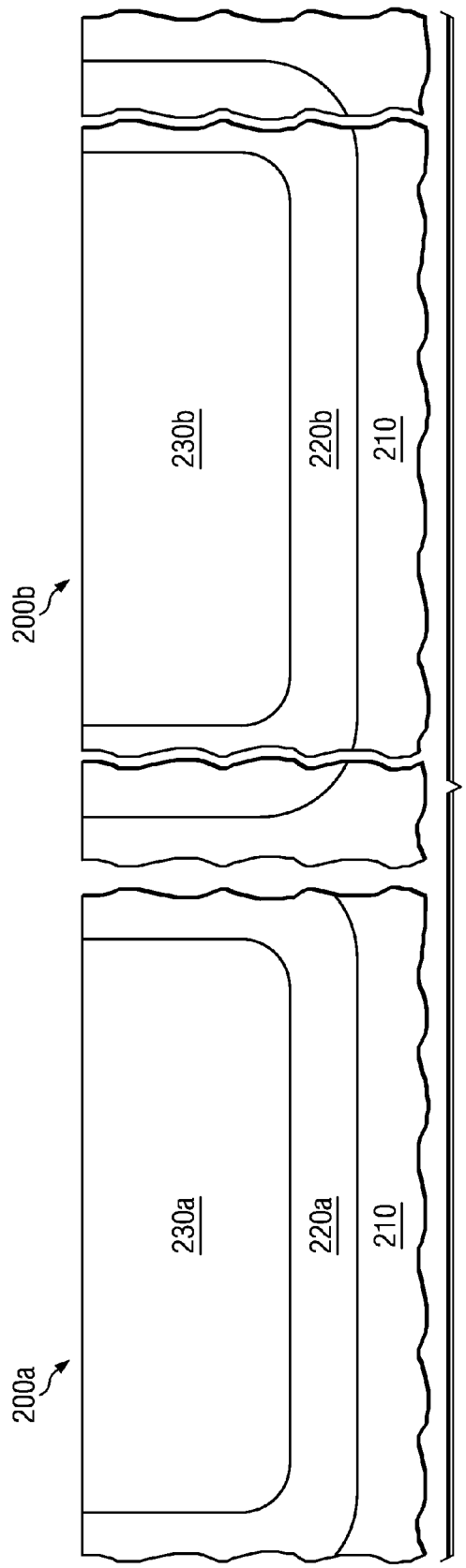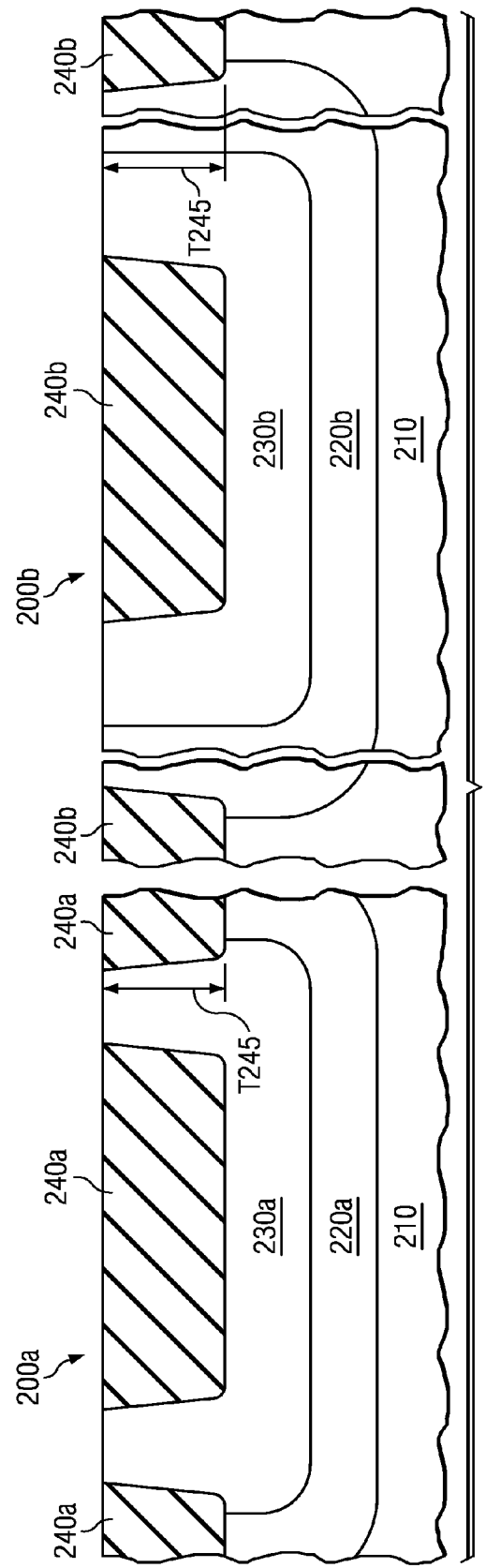

METHOD OF USING ELECTRICAL TEST STRUCTURE FOR SEMICONDUCTOR TRENCH DEPTH MONITOR

This invention relates generally to semiconductor trench depth monitors using an electrical trench test structure and methods for their use.

BACKGROUND

In the fabrication of semiconductor devices, isolation structures are formed between active areas in which electrical devices, such as transistors, memory cells or the like, are to be formed. The isolation structures are typically formed during initial processing of a semiconductor substrate, prior to the formation of electrical active devices. Typical isolation techniques include shallow trench isolation (STI), which may enable an active area with high density. In addition, the flatness of the resulting wafer enables more precise pattern definition for subsequent layers.

Shallow trench isolation (STI) techniques involve the formation of shallow trenches, which may then be filled with dielectric material, such as silicon dioxide, to provide electrical isolation. During the formation of shallow trenches, trench depth control across a wafer is critical in trench etching because the trench depth uniformity determines the uniformity of the fill and of the following planarization processes such as CMP (i.e., chemical-mechanical polishing). More importantly, as feature sizes decrease, precise control of the trench depth becomes even more critical for device performance.

One conventional technique for characterizing the trench depth is scanning electron microscope (SEM) cross section analysis. However, this conventional technique has drawbacks. For example, in order to do the cross section analysis, the wafer sample has to be destroyed to expose the cross section of the sample. In addition, the SEM analysis is time-consuming with turnaround times measured in days, which significantly delays diagnosing process issues. Further, SEM resolution presents a problem for repeatable depth measurement of submicron features.

A second conventional technique for characterizing the trench depth is stylus profilometry, which is a non-destructive method. In this method, step-height measurements are conducted on test structures to monitor trench depth before filling the trench. However, this method also has drawbacks. For example, one drawback is caused by the lack of high aspect ratio capability and high stylus forces that prevent within-die measurements.

A third conventional technique for characterizing the trench depth is in-line profilometry, such as an atomic force profilometry (AFP) technique, which is a non-destructive in-line monitor for smaller STI structures. The in-line profilometry technique may be used in a production environment. However, it also has drawbacks. For example, one drawback is that only limited data can be collected. To understand the process uniformity, it is often desired to collect statistical data for a wafer and/or further make a parametric correlation with device performance while monitoring the trench depth. However, in-line data is in general very limited and insufficient for this.

SUMMARY

A simple non-destructive method for semiconductor trench depth monitoring is described that uses an electrical trench test structure.

Disclosed embodiments include a method for monitoring trench depth in a semiconductor device having a pinch resistor formed in a semiconductor region. The conductivity type for the pinch resistor and the semiconductor region is opposite. In the pinch resistor, a trench can then be formed and filled with a dielectric material. The trench depth can be determined by measuring a pinch resistance of the pinch resistor.

Disclosed embodiments also include a method for monitoring semiconductor device performance wherein a semiconductor transistor is formed and a trench test structure is used to test isolation regions isolating the transistor. The trench test structure includes a semiconductor region including a pinch resistor and an isolation trench formed as part of the pinch resistor and filled with a dielectric material. The isolation trench depth is determined by monitoring the pinch resistance. An on-state resistance (Rdson) of the transistor may be determined based on the measured trench depth.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are illustrative and explanatory only and are not restrictive of the invention, as claimed.

BRIEF DESCRIPTION OF THE DRAWINGS

The accompanying drawings, which are incorporated in and constitute a part of the disclosure, illustrate several embodiments of the invention and, together with the written description, serve to explain the principles of the invention.

FIGS. 2A-2E depict cross-sectional views for an example trench test structure at various stages of fabrication in accordance with the present teachings.

DETAILED DESCRIPTION OF EXAMPLE EMBODIMENTS

Figure 1:
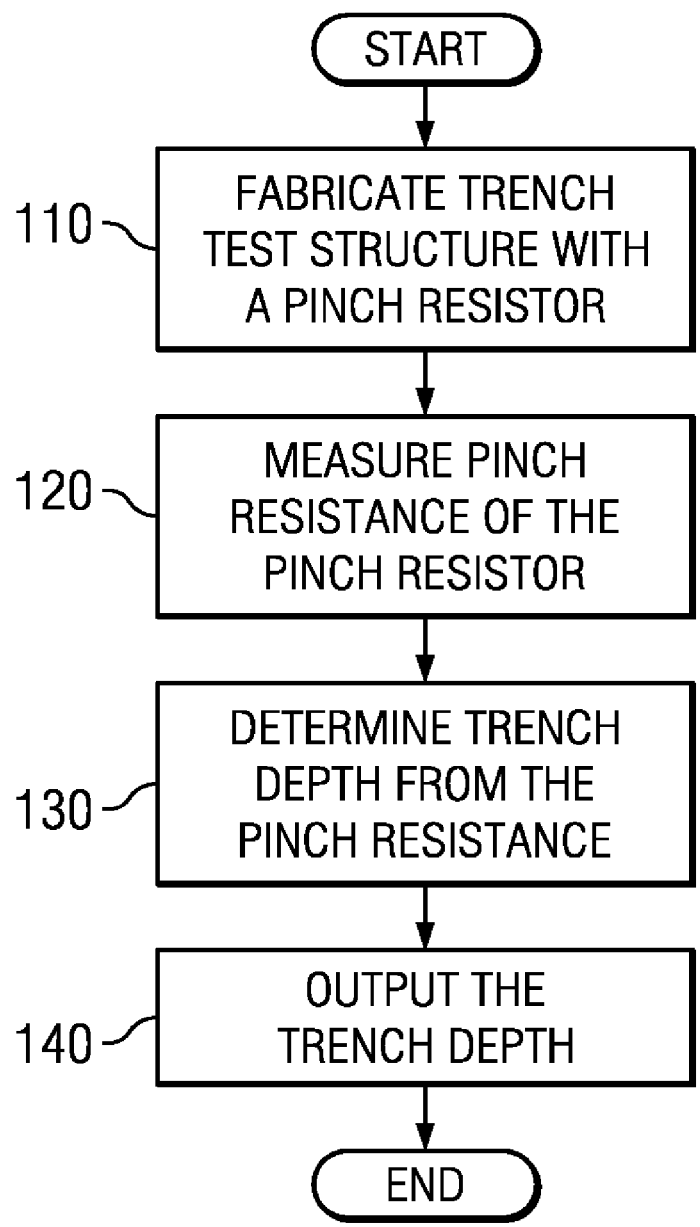
FIG. 1 depicts an example method for electrically monitoring a semiconductor trench depth using a trench test structure in accordance with the present teachings.

Example embodiments of the implementation of principles of the invention, are illustrated in the accompanying drawings. Like reference numerals refer to the same or like parts.

As used herein, a trench test structure may be formed including a pinch resistor. The trench test structure may be fabricated using semiconductor materials such as in a wafer with two different types of conductivity, for example, a p-type conductivity material may be disposed in an n-type region. In addition, a trench region may be formed on the p-type material region, wherein the p-type region may be the pinch resistor. Accordingly, the pinch resistor (i.e., the p-type region) may isolate the n-type region of the trench test structure from other wafer components.

In various embodiments, the trench test structure disclosed herein may be incorporated into a variety of active devices, such as, for example, transistors, memory cells or the like, to electrically monitor the trench depth and/or to monitor parameters that may be of interest for active devices. For example, for active devices such as MOS, CMOS, LDMOS and other transistors, a breakdown voltage and an on-state resistance (Rdson) may be important parameters which may be determined by monitoring corresponding trench depth using the trench test structure.

FIG. 1 depicts an example method for electrically monitoring semiconductor trench depth using the trench test structure in accordance with the present teachings. As shown, at 110, the trench test structure may be fabricated with a trench structure providing a pinch resistor in, for example, a production wafer having active devices, such as transistors, resident thereon.

In various embodiments, the trench test structure may be fabricated using linear BiCMOS manufacturing techniques, such as those developed by Texas Instruments Incorporated, for example, as described in U.S. Pat. No. 6,130,122, which is incorporated by reference herein in its entirety. The fabrication process may employ various known semiconductor fabrication techniques, such as, for example, photolithographic techniques, CVD (chemical vapor deposition) techniques, or etching techniques such as plasma dry etching. Various materials are deposited, grown, or implanted to form the trench test structure.

FIGS. 2A-2E show cross-sectional views for an example trench test structure 200a at various stages of fabrication in accordance with various embodiments, implemented together with an illustrative active device in the form of an LDMOS transistor 200b such as described in U.S. Pat. No. 6,900,101, the entirety of which is incorporated herein by reference. It should be readily obvious to one of ordinary skill in the art that the trench test structure depicted in FIGS. 2A-2E represents a generalized schematic illustration and that other regions/wells/layers may be added or existing regions/wells/layers may be removed or modified.

In FIG. 2A, the trench test structure 200a and LDMOS transistor 200b may be fabricated over a substrate 210 and may include deep wells 220a, 220b, and wells 230a, 230b formed within the deep wells 220. The deep wells 220a, 200b and wells 230a, 230b may, for example, take the form of wells 108 and 118 of the LDMOS transistor device 102 shown in FIG. 2A of U.S. Pat. No. 6,900,101. The trench test structure 200a may be formed as a pinch resistor. The deep well 220a may be a high voltage, low concentration, deep diffusion region that may serve to isolate the well 230a (i.e., the pinch resistor) from other wafer components.

In various embodiments, the trench test structure 200a may be fabricated as an STI trench test structure for various active devices such as the LDMOS transistor 200b. Accordingly, the substrate 210 may be a typical silicon substrate that is well-known to those skilled in the art. More specifically, the deep well 220a of the trench test structure 200a may be diffused on the silicon substrate 210. The deep well 220a may be a deep well of a first conductivity type of the trench test structure 200a. The conductivity type for the deep wells 220a, 200b and the silicon substrate 210 may be opposite. For example, typically, in an LDMOS transistor, the deep well 220b may be an n type (e.g., phosphorous doped), while the silicon substrate 210 may be a p type, as shown in FIG. 2B of U.S. Pat. No. 6,900,101.

The wells 230a, 230b may be double-diffused wells (Dwells) with p-type and n-type dopants co-implanted and diffused at the same time, having both n-type and p-type layers. During diffusion, the p-type and n-type regions of the wells 230a, 230b diffuse laterally as well as vertically. When the p-type dopant diffuses more than the n-type dopant, a p-type Dwell may result for the wells 230a, 230b. In various embodiments, the wells 230a, 230b may be any single-diffused wells. The wells 230a, 230b may have a second conductivity type that may be opposite to the conductivity type for the deep wells 220a, 22b. For example, in LDMOS transistor 200b, the well 230b may be a special p-type well used to build high voltage. In various embodiments, the well 230b may be a diffused or implanted p-type base region of a bipolar transistor.

In various embodiments, the use of p type and n type semiconductor regions may be reversed for the trench test structure 200a and the accommodated active devices such as transistor 200b. For example, the trench test structure 200a may be formed by an n type semiconductor region (such as for the deep wells 220a, 220b) having a first conductivity and a p type semiconductor region (such as for the wells 230a, 230b) having a second conductivity, or vice versa.

In FIG. 2B, trench regions 240a, 240b may be formed in the trench test structure 200a and transistor 200b by first forming trenches by etching cavities into the wafer shown in FIG. 2A using a nitride as an etch mask. Any suitable etch processes and/or chemistries well known to one of the ordinary skill in the art may be employed. The formed trenches may then be filled with dielectric material such as, for example, by depositing oxide or other dielectric into the trenches and over the remainder of the wafer and thus forming the trench regions 240a, 240b. Moreover, the trench depth of the trench regions 240a, 240b may be indicated by T245 as illustrated in FIG. 2B.

Figure 2C:
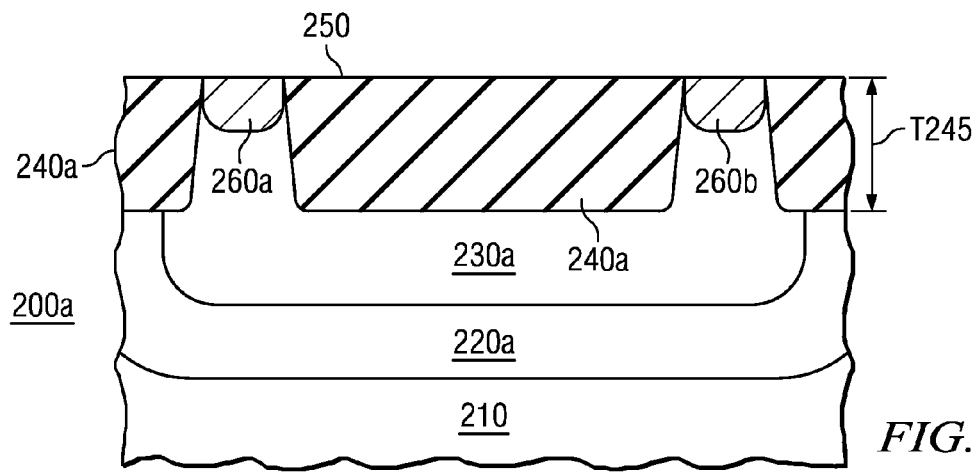

In FIG. 2C, a surface 250 may be formed by planarizing the entire surface 250 of the structures of FIG. 2B using for example CMP (chemical-mechanical polishing) or other suitable process to remove the dielectric from the active regions of the wafer while leaving the trenches filled with dielectric. In addition, the surface 250 may then be patterned using, for example, a photolithographic technique to heavily dope the patterned regions in the well 230 as moats 260a-b. The moats 260a-b may be implanted with the same type of conductivity as the well 230 (e.g., the second conductivity of the trench test structure), for example, a p-type dopant (e.g., boron) by an implantation process or a diffusion process.

In various embodiments, depending on which electrical active devices such as LDMOS transistor 200b the trench test structure is accommodated with, various active structures for electrical devices, such as source, drain or gate regions for MOS transistors (see, e.g., LDMOS transistor structures shown and described in U.S. Pat. No. 6,900,101), may be subsequently formed after planarizing the surface 250.

Figure 2D:
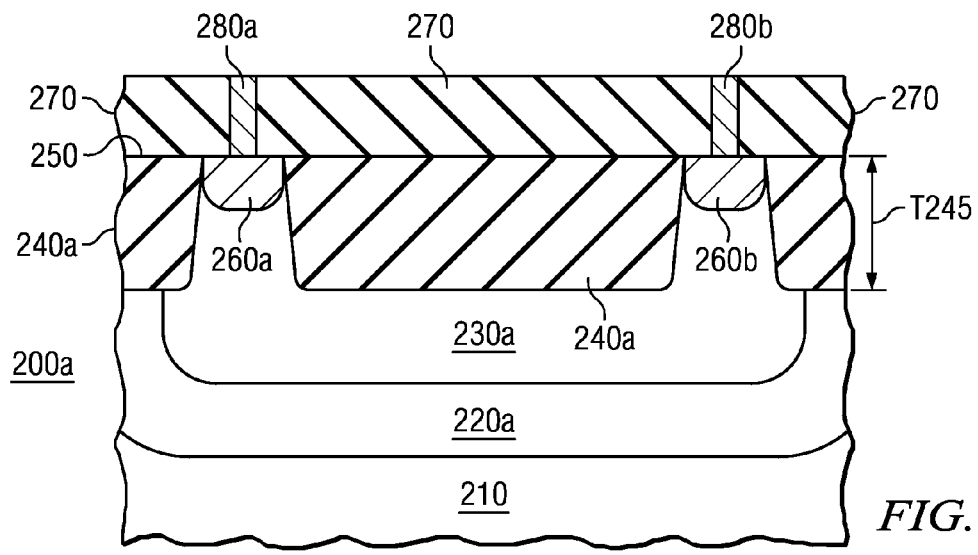

In FIG. 2D, a dielectric isolation layer 270, such as a silicon oxide layer, may be formed over the previously planarized surface 250 using, for example, CVD techniques. Conductive contacts 280a-b may then be formed through the dielectric layer 270 by first forming holes in the layer 270 using patterning and etching processes known to one of the ordinary skill in the art. The holes in the layer 270 may then be filled with conductive material, such as metal tungsten, to form contacts 280a, 280b using, for example, CVD techniques. In various embodiments, a planarization process such as CMP may then be conducted to polish the surface.

Figure 2E:
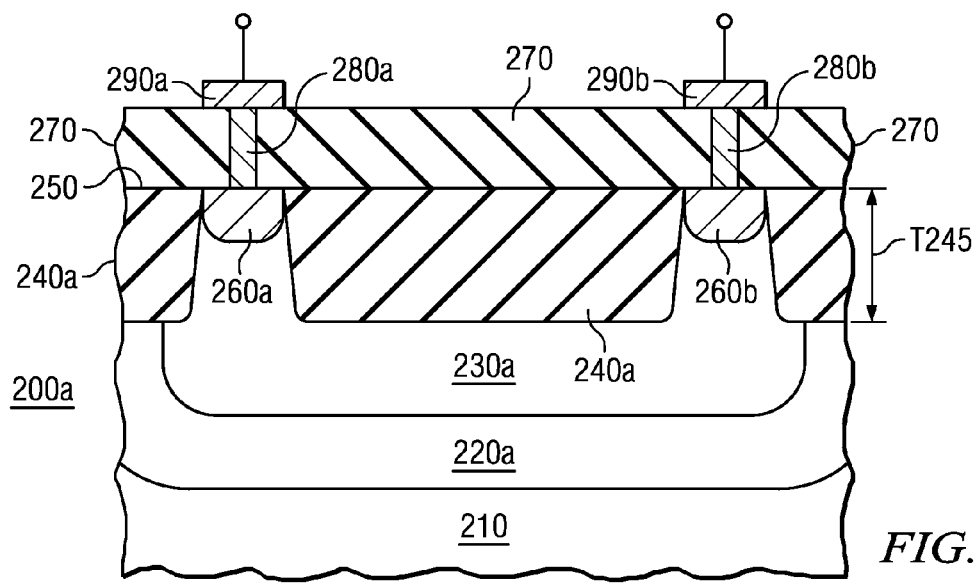

In FIG. 2E, metal contacts 290a, 290b may be formed on the conductive contacts 280a-b by first depositing a metal such as aluminum over the surface and then patterning and etching away metal from undesired regions while leaving metal contacts 290a-b.

Turning to FIG. 1, at 120, the formed trench test structure may be electrically monitored by measuring the pinch resistance R of the pinch resistor (i.e., well 230a in FIGS. 2A-2E). Specifically, the pinch resistance R may be measured by applying a voltage across the pinch resistor (the well 230a) via the metal contacts 290a, 290b in FIG. 2E. The current in the pinch resistor may be "pinched" by the trench depth T (see T245 in FIGS. 2B-2E).

At 130 in FIG. 1, the trench depth T may be correlated with the measured pinch resistance R. More specifically, the trench depth T may have a direct relationship with the pinch resistance R of the trench test structure. Thus, the trench depth T may be monitored by measuring the pinch resistance R. For example, the pinch resistance R and the trench depth T may be related by an equation generally of the form shown in equation (1):

$$y=ax+b; \qquad (1)$$

where y is the pinch resistance R, x is the trench depth T, and a and b are constants. The form of equation (1) may be determined by measuring the pinch resistance R at various trench depths T.

Figure 3:
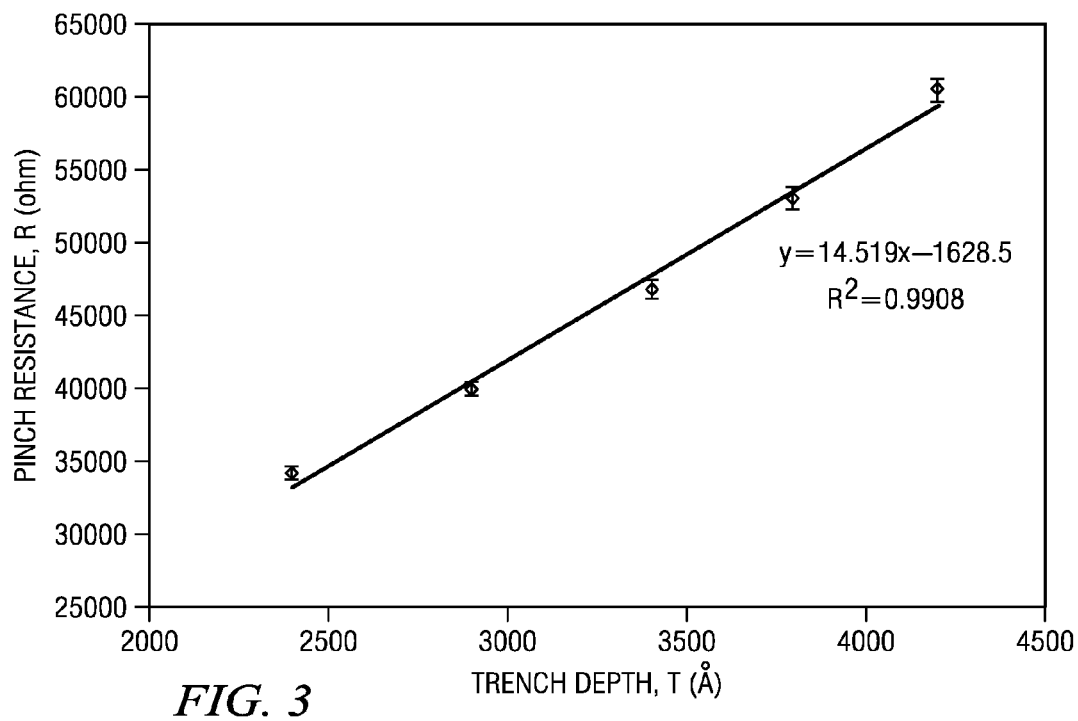
FIG. 3 depicts example experimental data for the trench depth and the corresponding pinch resistance plotted in a form of an x-y graph in accordance with the present teachings.

FIG. 3 shows example experimental data for the trench depth T and the corresponding pinch resistance R plotted in the form of an x-y graph. As shown, the line shape approximation of example data points may be expressed in equation (1) with constant a equal to 14.519, constant b equal to −1628.5 and an R-squared value of 0.9908 indicating a desired data confidence. Generally, a set of constants may cover a wide range of trench test structures.

In various embodiments, the set of constants, that is, a and b in equation (1), may vary with dimensions of the pinch resistor such as length L and width W of the well 230a in FIGS. 2C-2E. The length L and the width W of the well 230a may be determined by the pattern and geometry of the moats 260a, 260b in FIGS. 2C-2E, and may be well known to one of the ordinary skill in the art. Accordingly, a very small area (determined by L and W) of the pinch resistor (i.e., the well 230a) may be designed for the trench test structures for manufacturing efficiency and device quality. For example, a low or minimum width of the pinch resistor may be designed in a range from about 0.8 μm to about 20 μm for an efficient layout. More importantly, through these types of efficient designs, when measuring the pinch resistance R, very high resistances may be formed in such a very small area to effectively demonstrate the trench depth, and thus achieve high or maximum sensitivity for monitoring the trench depth.

It should be noted that although only a single trench test structure is shown in FIGS. 1-3, the actual wafer may include numerous trench test structures fabricated with active devices according to a layout that may be optimized for manufacturing efficiency and device quality.

Figure 4:
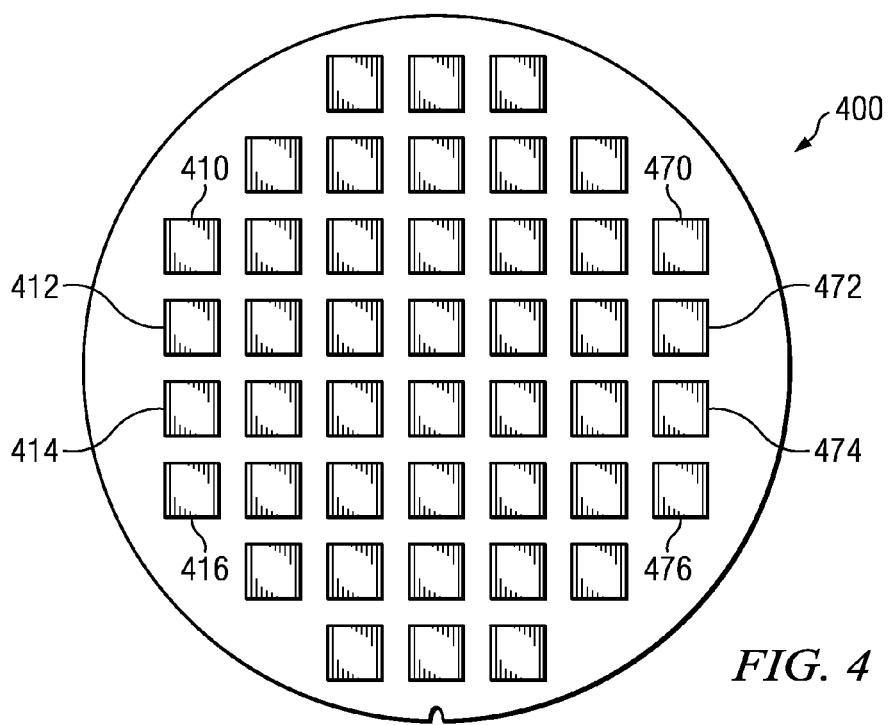
FIG. 4 depicts an example wafer map for pinch resistance of the trench test structure in accordance with the present teachings.

FIG. 4 depicts an example wafer map for pinch resistances with a number of trench test structures distributed across the wafer 400. The number on each trench test structure may indicate a pinch resistance R for a corresponding trench test structure. For example, as shown in FIG. 4, some of example trench test structures on the left of wafer 400, such as 410, 412, 414, and 416, may have pinch resistances of about 53,990 ohms (for 414) to 55,538 ohms (for 410). In another example, some of example trench test structures on the right of wafer 400, such as 470, 472, 474, and 476, may have pinch resistances of about 52,762 ohms (for 474) to 53,642 ohms (for 476), indicating lower pinch resistances on the right of the wafer 400. In various embodiments, various active devices may be fabricated incorporating the trench test structures, for example, one or more MOS transistors such as NMOS, PMOS, CMOS, or LDMOS transistors may be fabricated from the wafer 400.

By measuring pinch resistances for the wafer 400, statistical pinch resistance data across the wafer may be obtained. Correlated with equation (1), statistical trench depth data may then be obtained for the wafer 400. Accordingly, the process uniformity of the wafer may be monitored. For example, in FIG. 4, the example trench test structures with lower pinch resistances on the right of the wafer 400, such as, for example, 470, 472, 474, 476, may indicate more shallow trench depths on the right of the example wafer 400. In various embodiments, the electrical monitoring of trench depths may be implemented as a production monitor in production wafer scribe lanes.

At 140 in FIG. 1, individual or statistical data (i.e., wafer map) for the trench depth T, and/or the pinch resistance R for trench test structures such as STI or any other type of trench structures may be obtained and output. Furthermore, the process uniformity across the wafer may be output.

In various embodiments, electrical monitoring of trench depth may be very critical for active devices such as devices for analog high voltage, for example, MOS transistors. Generally, the trench depth has significant impact on the device performance such as the breakdown voltage, the on-state resistance (Rdson), etc. Accordingly, electrical monitoring of trench depth may be used to monitor performance parameters for active devices.

Figure 5:
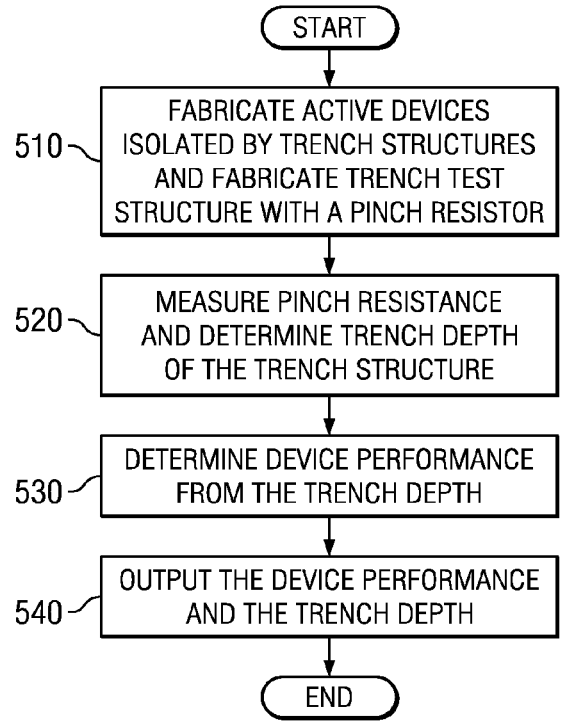
FIG. 5 depicts an example method for monitoring device performance using the trench test structure in accordance with the present teachings.

FIG. 5 depicts an example method for determining device performance using a trench test structure. At 510, an example active device, such as an LDMOS transistor, may be fabricated and isolated by a trench structure together with a trench test structure providing a pinch resistor including a same trench structure formed in a well. An example LDMOS transistor with shallow trench isolation (STI) formation is described in the U.S. Pat. No. 6,900,101, mentioned above. For example, the fabricated LDMOS may be a "high side" 60 Volt device, where the 60 Volt specification refers to its rated breakdown voltage.

At 520, the pinch resistance R may be monitored by the trench test structure to determine its trench depth T. In various embodiments, a wafer map (for example, as shown in FIG. 4) for the pinch resistor R may be monitored and recorded. The trench depth may then be determined by the corresponding pinch resistance R according to equation (1) or FIG. 3. Accordingly, statistical data for trench depth may be obtained across a wafer.

Figure 6:
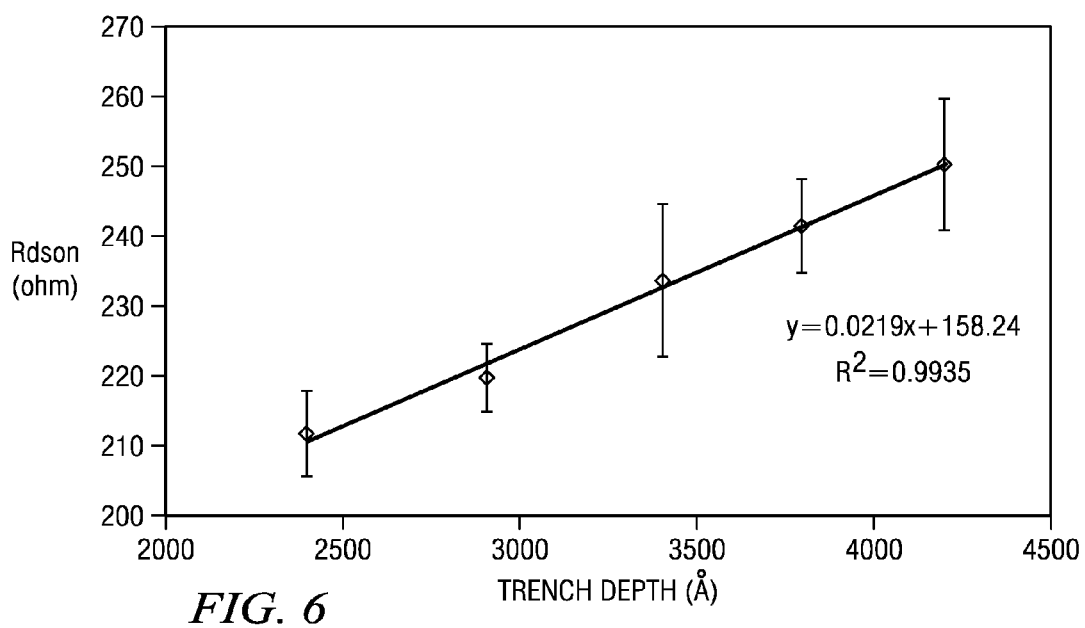
FIG. 6 depicts an example set of data points for the trench depth and a corresponding on-state resistance (Rdson) for an example LDMOS transistor in accordance with the present teachings.

At 530, the trench depth T may further have a direct relationship with the on-state resistance (Rdson) for transistors such as LDMOS transistors. For example, the Rdson and the trench depth may be related by an equation generally of the form shown in equation (2):

$$y=mx+n; \qquad (2)$$

where y is the Rdson, x is the trench depth T, and m and n are constants. The form of equation (2) may be determined by testing Rdson at various trench depths T, which may be determined by the electrical monitoring of pinch resistance R in equation (1). The trench depth T and the on-state resistance (Rdson) may be plotted in the form of an x-y graph. FIG. 6 shows an example set of data points for trench depth and the corresponding Rdson for an LDMOS transistor along with their line shape approximation.

As shown in FIG. 6, the line shape approximation of example data points expressed in the equation (2) indicates a set of constants for m and n (i.e., 0.0219 and 158.24, respectively), and an R-squared value of 0.9935 indicating a desired data confidence. Generally, a set of constants may cover a wide range of active devices, that is, LDMOS transistors in this example.

Correlating equations (1) and (2), the pinch resistance R measured at 520 may be directly correlated with parameters of interest for device performance such as the on-state resistance (Rdson) of the example LDMOS device. More specifically, the Rdson in equation (2) may be correlated with the pinch resistance R in equation (1) by the common parameter, the trench depth T. For example, equation (1) may be in a form of:

$$R = aT + b; \quad (3)$$

where R is the pinch resistance, T is the trench depth, and a and b are constants. Equation (2) may be in the form of:

$$Rdson = mT + n; \quad (4)$$

where Rdson is the on-state resistance, T is the trench depth, and m and n are constants. Comparing equations (3) and (4), the on-state resistance (Rdson) may be correlated with the pinch resistance R as:

$$Rdson = \left(\frac{m}{a}\right)R + \left(n - \frac{mb}{a}\right); \quad (5)$$

where $$\left(\frac{m}{a}\right) \text{ and } \left(n - \frac{mb}{a}\right)$$

are constants for a certain active device. Accordingly, the on-state resistance (Rdson) for the active device LDMOS transistor may be monitored by electrically measuring the pinch resistance R of the trench test structure. Moreover, because of the pinch resistance R may be obtained statistically, a wafer map for the on-state resistance (Rdson) may also be obtained. Further, the electrical monitoring of Rdson may be implemented as a process monitor in production scribe lanes.

At 540, the active device performance such as the on-state resistance (Rdson) and the trench depth may be output individually or statistically across the wafer. In addition, the process uniformity of the wafer may be analyzed.

Other embodiments of the invention will be apparent to those skilled in the art from consideration of the specification and practice of the invention disclosed herein. It is intended that the specification and examples be considered as illustrative only, with a true scope and spirit of the invention being indicated by the claims.

What is claimed is:

1. A method for monitoring trench depth in the fabrication of a semiconductor device including a transistor, comprising:
   providing a substrate having semiconductor regions of given conductivity type;
   forming well regions of opposite conductivity type within respective ones of the semiconductor regions, a first well region forming a well region of a pinch resistor and a second well region forming a well region of the transistor;
   forming a first trench region within the first well region of the pinch resistor and a second trench region for isolation of the transistor; the first and second trench regions having a trench depth and being formed by etching cavities in the substrate, filling the cavities with a dielectric material, and planarizing;
   measuring a pinch resistance of the pinch resistor;
   determining the trench depth from the pinch resistance; and
   determining a parameter of the transistor based on the determined trench depth.

2. The method of claim 1, wherein the semiconductor regions of given conductivity type comprise deep wells formed in the substrate; and the well regions of opposite conductivity type are formed within the deep wells.

3. The method of claim 1, wherein at least the one well region forming the well region of the pinch resistor comprises a double-diffused well or a single-diffused well.

4. The method of claim 1, wherein the semiconductor regions of given conductivity type comprise n type semiconductor regions; and the well regions of opposite conductivity type comprise p type well regions.

5. The method of claim 1, wherein determining the trench depth from the pinch resistance comprises determining a linear correlation of the trench depth with the pinch resistance.

6. The method of claim 1, wherein the pinch resistor is formed to have a width of about 0.8 µm to about 20 µm.

7. The method of claim 1, wherein the substrate comprises a wafer; and measuring the pinch resistance is used for determining a trench depth uniformity across the wafer.

8. The method of claim 1, wherein the transistor is a MOS transistor, and the parameter comprises an on-state resistance (Rdson).

9. The method of claim 8, wherein determining the on-state resistance (Rdson) of the MOS transistor comprises determining a linear correlation of the on-state resistance (Rdson) with the trench depth.

10. The method of claim 1, wherein the trench regions comprise shallow trench isolation (STI) structures.

11. A method for fabricating a semiconductor device including an extended drain MOS transistor, comprising:
    providing a substrate having first and second semiconductor deep well regions of given conductivity type;
    forming first and second well regions of opposite conductivity type within respective ones of the semiconductor deep well regions, the first well region forming a well region of a pinch resistor and the second well region forming a well region of the transistor;
    forming a first shallow trench isolation region within the first well region of the pinch resistor and a second trench region for isolation of the transistor; the first and second trench regions having a trench depth and being formed by etching cavities in the substrate, filling the cavities with a dielectric material, and planarizing;
    measuring a pinch resistance of the pinch resistor;
    determining the trench depth from the pinch resistance; and
    determining a parameter of the transistors based on the determined trench depth.

* * * * *